United States Patent [19]

Etoh et al.

[11] 4,145,222

[45] Mar. 20, 1979

[54] WATER SOLUBLE PHOTOSENSITIVE RESIN COMPOSITION COMPRISING A POLYAMIDE OR ITS AMMONIUM SALT

[75] Inventors: Kuniomi Etoh; Masaru Nanpei, both of Otsu, Japan

[73] Assignee: Toyobo Co., Ltd., Osaka, Japan

[21] Appl. No.: 781,307

[22] Filed: Mar. 25, 1977

Related U.S. Application Data

[63] Continuation of Ser. No. 525,106, Nov. 19, 1974, abandoned.

[51] Int. Cl.² ............................................. G03C 1/68
[52] U.S. Cl. ............................... 96/115 P; 96/115 R; 204/159.15
[58] Field of Search ......................... 96/115 R, 115 P; 204/159.15

[56] References Cited

U.S. PATENT DOCUMENTS

| | | | |
|---|---|---|---|
| 3,486,903 | 12/1969 | Henkler et al. | 96/115 R |
| 3,551,148 | 12/1970 | Faulhaber et al. | 96/35.1 |
| 3,684,516 | 8/1972 | Ishii | 96/115 R |
| 3,832,188 | 8/1974 | Bamba et al. | 96/115 P |
| 3,873,319 | 3/1975 | Berg | 96/115 P |

*Primary Examiner*—Jack P. Brammer
*Attorney, Agent, or Firm*—Birch, Stewart, Kolasch and Birch

[57] ABSTRACT

A photosensitive resin composition which comprises a polymer having a basic nitrogen atom in the main or side chain, which is represented by the formula:

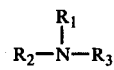

wherein $R_1$, $R_2$ and $R_3$ are each a hydrogen atom or a substituted or unsubstituted hydrocarbon group, at least one of $R_1$ to $R_3$ representing a polymeric chain, a photopolymerizable unsaturated monomer and a photosensitizer.

16 Claims, No Drawings

WATER SOLUBLE PHOTOSENSITIVE RESIN COMPOSITION COMPRISING A POLYAMIDE OR ITS AMMONIUM SALT

This application is a continuation, of copending application Ser. No. 525,106, filed on Nov. 19, 1974 now abandoned.

The present invention relates to a photosensitive resin composition.

It is known that a relief printing plate can be prepared by exposing a photosensitive material comprising a layer of a photosensitive resin composition (hereinafter referred to as "photosensitive layer") and a support therefor through a negative or positive film having a transparent image to an active light so as to cure and make insoluble the photosensitive resin composition at the exposed part and then removing off the photosensitive resin composition at the non-exposed part with a suitable solvent. Such photosensitive resin composition comprises usually a photocopolymerizable unsaturated monomer, a polymer which is soluble in a suitable solvent and, when photopolymerized with the said monomer, becomes insoluble, a photosensitizer and a thermal polymerization inhibitor. Namely, the said photosensitive resin composition, especially the said polymer, should be soluble in a suitable solvent before exposure but becomes insoluble in the same solvent after exposure. Further, the said polymer should show a large mechanical strength and not be swollen by organic solvents after photopolymerization with the photopolymerizable unsaturated monomer. As such polymer, there have been proposed some copolymerized polyamides, which are soluble in alcohols (cf. Japanese patent publications Nos. 14719/1960, 15513/1960 and 7330/1970). These known polyamides are good in mechanical strength and resistance to solvents after photopolymerization but their solubility to solvents before photopolymerization is considerably lowered. Therefore, it takes a relatively long time to remove the photosensitive resin composition comprising such polyamide at the non-exposed part by washing in order to obtain a relief printing plate having an image of distinct contour. In addition, the use of large amounts of alcohols as the solvents causes various troubles on storage, handling, discard and the like.

As the result of extensive studies, there has now been provided a photosensitive resin composition which is readily dissolved in water or a dilute aqueous acid before photopolymerization and which becomes insoluble therein showing an excellent mechanical strength after photopolymerization.

The photosensitive resin composition of the present invention comprises a polymer having a basic nitrogen atom in the main or side chain, a photopolymerizable unsaturated monomer and a photosensitizer.

The polymer having a basic nitrogen atom in the main or side chain to be used in the invention is representable by the formula:

wherein $R_1$, $R_2$ and $R_3$ are each a hydrogen atom or a substituted or unsubstituted hydrocarbon group, at least one of $R_1$ to $R_3$ representing a polymeric chain.

The polymer (A) may be a polyamide (A-1) or a vinyl polymer (A-2), which has a basic nitrogen atom in the main or side chain.

The polyamide (A-1), which has a basic nitrogen atom in the main chain, may be prepared, for instance, by the use of at least one of the compounds represented by either one of the formulae:

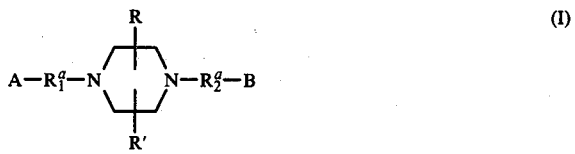

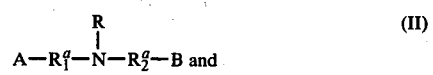

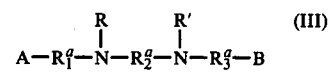

wherein R and R' are each a hydrogen atom or a hydrocarbon group (preferably having 1 to 10 carbon atoms), $R_1^a$, $R_2^a$ and $R_3^a$ are each an alkylene group (preferably having 1 to 15 carbon atoms) and A and B are each —NH$_2$, —COOH or —COOR" (R" being a hydrocarbon group (preferably having 1 to 10 carbon atoms)) as the starting monomer. Still, the group of the formula: —$R_2^a$—B in the monomer (I) may represent a hydrogen atom.

As the monomer (I), there may be exemplified diamines (e.g., N-(2-aminoethyl)piperazine, N-(2-aminopropyl)piperazine, N-(6-aminohexyl)piperazine, N-(4-aminocyclohexyl)piperazine, N-(2-aminoethyl)-3-methylpiperazine, N-(2-aminoethyl)-2,5-dimethylpiperazine, N-(2-aminopropyl)-3-methylpiperazine, N-(3-aminopropyl)-2,5-dimethylpiperazine, N,N'-bis(aminomethyl)piperazine, N,N'-bis(2-aminoethyl)piperazine, N,N'-bis(2-aminoethyl)methylpiperazine, N-(aminomethyl)-N'-(2-aminoethyl)piperazine, N,N'-bis(3-aminopentyl)piperazine), dicarboxylic acids (e.g. N,N'-bis(carboxymethyl)piperazine, N,N'-bis(carboxymethyl)methylpiperazine, N,N'-bis(carboxymethyl)-2,6-dimethylpiperazine, N,N'-bis(2-carboxyethyl)piperazine, N,N'-bis(3-carboxypropyl)piperazine, N-(2-carboxyethyl)-N'-(carboxymethyl)piperazine) and their reactive derivatives such as the lower alkyl esters and acid halides thereof, ω-amino acids (e.g. N-carboxymethylpiperazine, N-(2-carboxyethyl)piperazine, N-(3-carboxypropyl)piperazine, N-(6-carboxyhexyl)piperazine, N-(4-carboxycyclohexyl)piperazine, N-(2-carboxyethyl)-3-methylpiperazine, N-(2-carboxyethyl)-2,5-dimethylpiperazine, N-(aminomethyl)-N'-(carboxymethyl)piperazine, N-(aminomethyl-N'-(2-carboxyethyl)piperazine, N-(2-aminoethyl)-N'-(2-carboxyethyl)piperazine, N-(aminomethyl)-N'-(carboxymethyl)-2-methylpiperazine), etc.

As the monomer (II), there may be exemplified diamines (e.g. N,N'-bis(2-aminoethyl)cyclohexylamine, N,N-bis(3-aminopropyl)amine, N,N-bis(2-aminoethyl)methylamine, N,N-bis(3-aminopropyl)ethylamine, N,N-bis(3-aminopropyl)isopropylamine, N,N-bis(3-aminopropyl)cyclohexylamine, N,N-bis(4-amino-n-butyl)amine, N-(2-aminoethyl)-N-methyl-1,3-propanediamine), dicarboxylic acids (e.g. N,N-bis(carboxymethyl)methylamine, N,N-bis(2-carboxyethyl)ethylamine, N,N-bis(2-carboxyethyl)methylamine, N,N-bis(2-carboxyethyl)isopropylamine, N-carboxymethyl-N-(2-carboxyethyl)methylamine) and their reactive derivatives such as the lower alkyl esters and acid halides thereof, ω-amino acids (e.g., N-(aminomethyl)-N-(carboxymethyl)methylamine, N-(2-aminoethyl)-N-(2-carboxyethyl)methylamine, N-(aminomethyl)-N-(2-carboxyethyl)isopropylamine, N-(3-aminopropyl)-N-(3-carboxypropyl)methylamine, N-(3-aminopropyl)-N-(2-carboxyethyl)methylamine), etc.

As the monomer (III), there may be exemplified diamines (e.g., N,N'-dimethyl-N,N'-bis(3-aminopropyl)ethylenediamine, N,N'-dimethyl-N,N'-bis(3-aminopropyl)tetramethylenediamine, N,N'-diisobutyl-N,N'-bis(3-aminopropyl)hexamethylenediamine, N,N'-dicyclohexyl-N,N'-bis(3-aminopropyl)hexamethylenediamine, N,N'-diethyl-N,N'-bis(3-aminopropyl)-2,2,4-trimethylhexamethylenediamine), dicarboxylic acids (e.g. N,N'-dimethyl-N,N'-bis(carboxymethyl)ethylenediamine, N,N'-dimethyl-N,N'-bis(2-carboxyethyl)ethylenediamine, N,N'-dimethyl-N,N'-bis(3-carboxypropyl)hexamethylenediamine) and their reactive derivatives such as the lower alkyl esters and acid halides thereof, ω-amino acids (e.g., N,N'-dimethyl-N-(aminomethyl)-N'-(carboxymethyl)ethylenediamine, N,N'-dimethyl-N-(2-aminoethyl)-N'-(2-carboxyethyl)ethylenediamine, N,N'-dimethyl-N-(aminomethyl)-N'-(2-carboxyethyl)hexamethylenediamine, etc.

The polyamide (A-1), which has a basic nitrogen atom in the side chain, may be prepared, for instance, by the use of at least one of the compounds represented by the formula:

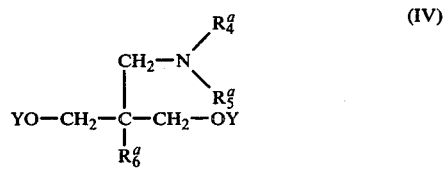
(IV)

wherein $R_4^a$ and $R_5^a$ are each a hydrocarbon group (preferably having 1 to 10 carbon atoms) or they may be linked together to form a ring, $R_6^a$ is a lower alkyl group (preferably having 1 to 3 carbon atoms or a group of the formula:

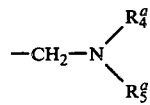

(wherein $R_4^a$ and $R_5^a$ are each as defined above) and Y is a γ-aminopropyl group as the starting monomer.

As the monomer (IV), there may be exemplified diamines (e.g. 6-methyl-6-(N,N-dimethylaminomethyl)-4,8-dioxaundecanediamine, 6-methyl-6-(N,N-diethylaminomethyl)-4,8-dioxaundecanediamine, 6-ethyl-6-(N,N-dimethylaminomethyl)-4,8-dioxaundecanediamine, 8,6-bis(N,N-dimethylaminomethyl)-4,8-dioxaundecanediamine), etc.

These monomers may be used solely or in combination.

In addition to the monomers (I) to (IV), aliphatic and/or aromatic dicarboxylic acids, diamines, ω-amino acids and lactams as usually employed for the preparation of polyamides may be also used as the monomeric components in production of the polyamide (A-1).

Examples of the dicarboxylic acids are aliphatic and/or aromatic dicarboxylic acids (e.g., succinic acid, adipic acid, glutaric acid, azelaic acid, sebacic acid, dodecanedicarboxylic acid, terephthalic acid, isophthalic acid, cyclohexanedicarboxylic acid), etc. Their reactive derivatives such as the lower alkyl esters and acid halides thereof are also utilizable. Examples of the diamines are saturated aliphatic diamines having a straight chain (e.g., tetramethylenediamine, pentamethylenediamine, hexamethylenediamine, heptamethylenediamine, octamethylenediamine, nonamethylenediamine, decamethylenediamine), aromatic diamines (e.g., metaxylylenediamine, paraxylylenediamine), alicyclic diamines (e.g., cyclohexanebismethylamine), etc. Examples of the ω-amino acids are aminocaproic acid, aminoheptanoic acid, aminocaprylic acid, aminocapric acid, aminolauric acid, etc. Examples of the lactams are ε-caprolactam, α-methyl-ε-caprolactam, ε-methyl-ε-caprolactam, cyclopeptanoneisoxime, cyclooctanoneisoxime, etc.

The polyamide (A-1) may be prepared by conventional polymerization procedures. The amount of the monomeric component containing a basic nitrogen atom such as the monomers (V) to (IV) may be usually 10 to 100 mol %, preferably 20 to 50 mol %, of the total amount of the monomeric components of the polyamide.

The vinyl polymer (A-2), which has a basic nitrogen atom in the main or side chain, may be prepared, for instance, by the use of at least one of the compounds represented by the formula:

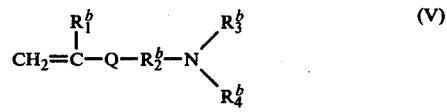
(V)

wherein $R_1^b$ is a hydrogen atom or a hydrocarbon group (preferably having 1 to 10 carbon atoms, $R_2^b$ is an alkylene group (preferably having 1 to 15 carbon atoms), $R_3^b$ and $R_4^b$ are each a hydrocarbon group (preferably having 1 to 10 carbon atoms) and Q is an ester linkage or an amide linkage as the starting monomer.

Examples of the monomer (V) are acrylates and methacrylates (e.g., 2-(N,N-dimethylamino)ethyl acrylate, 2-(N,N-dimethylamino)ethyl methacrylate, 2-(N,N-diethylamino)ethyl acrylate, 2-(N,N-diethylamino)ethyl methacrylate, 2-(N,N-dibutylamino)ethyl acrylate, 2-(N,N-dibutylamino)ethyl methacrylate, 3-(N,N-diethylamino)propyl acrylate, 3-(N,N-diethylamino)propyl methacrylate), acrylamides and methacrylamides (e.g. 3-(N,N-dimethylamino)propyl acrylate, 3-(N,N-dimethylamino)propyl methacrylate, 3-(N,N-diethylamino)propyl acrylate, 3-(N,N-diethylamino)propyl methacrylate), etc.

These monomers may be used solely or in combination.

In addition to the monomer (V), any vinyl monomer which is conventionally employed in the production of vinyl polymers may be used.

Examples of such vinyl monomer are styrene, vinyl chloride, vinylidene chloride, acrylonitrile, methacrylonitrile, acrylamide, methacrylamide, methyl acrylate, methyl methacrylate, vinyl acetate, N-vinylpyrrolidone, methyl vinyl ketone, ethylene, propylene, acrylic acid, methacrylic acid, etc.

The vinyl polymer (A-2) may be prepared by conventional polymerization procedures. The amount of the monomeric component containing a basic nitrogen atom such as the monomer (V) may be usually 10 to 100 mol %, preferably 20 to 50 mol %, of the total amount of the monomeric components of the vinyl polymer.

The polymer (A) as above prepared may be used as such or in an ammonium salt form in the photosensitive resin composition of the invention.

For conversion of the polymer (A) into its ammonium salt form, the former may be treated with a protonic acid, a quaternizing agent or a protonic acid and an epoxy compound. The treatment may be effected, for instance, by dissolving the polymer (A) together with a protonic acid, a quaternizing agent or a protonic acid and an epoxy compound (preferably an unsaturated epoxy compound) in a suitable solvent at an appropriate temperature, by melting a mixture of the polymer (A) together with the said reagent(s), or by contacting the polymer (A) with the said reagent(s) in a gaseous state. Alternatively, such treatment may be carried out on or after admixing the polymer (A) with a photopolymerizable unsaturated monomer, a photosensitizer and/or a thermal polymerization inhibitor.

The resulting polymer in ammonium salt form is representable by the formula:

(B)

wherein $R_1$, $R_2$, $R_3$ and $R_4$ are each a hydrogen atom or a substituted or unsubstituted hydrocarbon group, at least one of $R_1$ to $R_4$ representing a polymeric chain, and X is an anion to be paired with the ammonium ion.

As the protonic acid, there may be used an inorganic acid (e.g., hydrochloric acid, sulfuric acid) or an organic acid (e.g., formic acid, acetic acid, chloroacetic acid, maleic acid, phthalic acid, adipic acid, acrylic acid). Among them, the one containing a polymerizable unsaturated bond in its molecule such as acrylic acid, maleic acid or cinnamic acid can also serve as a cross linking agent to promote the curing.

As the quaternizing agent, there may be exemplified alkyl halides (e.g., methyl chloride, ethyl chloride, methyl bromide, methyl iodide, ethyl chloride, ethyl bromide, lauryl chloride), aralkyl halides (e.g., benzyl chloride), 1,2-dichloroxylene, 1,3-dichloroxylene, ethylenechlorohydrin, 2-chloroethyl acrylate, 2-chloroethyl methacrylate, 2,3-dibromopropyl acrylate, 2,3-dibromopropyl methacrylate, 3-chloro-2-hydroxypropyl acrylate, 3-chloro-2-hydroxypropyl methacrylate, dialkyl sulfates, alkyl p-toluenesulfonates, etc.

As the epoxy compound, there may be preferably used the unsaturated one represented by the formula:

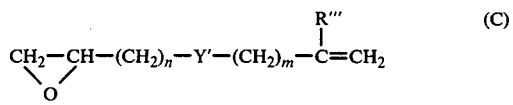

(C)

wherein R''' is a hydrogen atom or a lower alkyl group, Y' is —OOC—, —HNCO—, —O—, —SO₃— or —HNCONH—, n is an integer of 0 to 3 and m is 0 or 1. Specific examples are glycidyl acrylate, glycidyl methacrylate, N-glycidyl acrylamide, N-glycidyl methacrylamide, vinyl glycidyl ether, allyl glycidyl ether, glycidyl vinylsulfonate, N-isopropenylglycidylurethane, etc. The amount of the epoxy compound may be 0.02 to 10 mol, preferably 0.05 to 5 mol, to 1 mol of the basic nitrogen atom in the polymer (A).

The amounts of the protonic acid and the quaternizing agent may be appropriately decided depending on the amount of the basic nitrogen atom in the polymer (A), the solubility of the resultant polymer (B) and the like.

The thus obtained polymer (B) contains a nitrogen atom in ammonium salt form in the main or side chain and is readily soluble to water or a dilute aqueous acid. In particular, a large solubility to water is obtained when at least $1 \times 10^{-3}$ mol of the nitrogen atom in ammonium salt form is present in 1 g of the polymer (B).

As the photopolymerizable unsaturated monomer to be used in the photosensitive resin composition of the invention, there may be exemplified monomers containing one double bond (e.g., acrylic acid, methacrylic acid, methyl acrylate, methyl methacrylate, benzyl acrylate, tribromophenyl acrylate, cyclohexyl acrylate, 2-hydroxypropyl acrylate, acrylamide, methacrylamide, N-methylolacrylamide, n-butoxymethylacrylamide, isobutoxymethylacrylamide, N-tert-butylacrylamide, sodium acrylate, ammonium acrylate, acrylonitrile, styrene, sodium styrenesulfonate, vinyl pyridine) and monomers containing two or more double bonds (e.g., glycidyl methacrylate, allyl methacrylate, ethylene glycol diacrylate, ethylene glycol dimethacrylate, 1,3-propanediol diacrylate, 1,3-propanediol dimethacrylate, 1,4-butanediol diacrylate, 1,4-butanediol dimethacrylate, 1,6-hexanediol diacrylate, 1,6-hexanediol dimethacrylate, trimethylol propane triacrylate, trimethylolpropane trimethacrylate, tetramethylolmethane triacrylate, triacryloyloxyethyl phosphate, methylenebisacrylamide, ethylenebisacrylamide, propylenebisacrylamide, butylenebisacrylamide, methylenebismethacrylamide, ethylenebismethacrylamide, propylenebismethacrylamide). These monomers show a good compatibility with the said polymer (A) or (B) and may be used solely or in combination. The sole use of the monomer having at least two double bonds or the combined use of the monomers having at least one double bond is particularly favorable.

The amount of the monomer may be 5 to 150% by weight, preferably 10 to 100% by weight, to the polymer (A) or (B) in the photosensitive resin composition. When the amount is smaller than 5% by weight, the insolubility at the exposed part is insufficient. When the amount is larger than 150% by weight, the mechanical strength of the photosensitive layer after exposure is deteriorated.

As the photosensitizer, there may be employed any one which can promote the polymerization of the said monomer within the matrix of the polymer. Specific examples are anthraquinones (e.g., 9,10-anthraquinone, 1-chloro anthraquinone, 2-chloroanthraquinone), benzophenones (e.g., benzophenone, p-aminobenzophenone, p-chlorobenzophenone), benzoins (e.g., benzoin, benzoin methyl ether, benzoin ethyl ether, α-methylbenzoin), benzyls, etc. The amount of the photosensitizer may be 0.01 to 5% by weight, preferably 0.1 to 2% by weight, to the total amount of the polymer (A) or (B) and the photopolymerizable unsaturated monomer.

The photosensitive resin composition can be prepared by admixing uniformly the polymer (A) or (B), the photopolymerizable unsaturated monomer and the photosensitizer, or by admixing uniformly the polymer (A), the protonic acid, the quaternizing agent or the protonic acid and the epoxy compound, the photopolymerizable unsaturated monomer and the photosensitizer. The admixing may be effected, for instance, by dissolving the materials in a suitable solvent (e.g., water, methanol, ethanol, isopropanol, chloroform, carbon tetrachloride, toluene, xylene) and removing the solvent by evaporation, or by mixing the materials in a melted state under such conditions as not to cause thermal polymerization of the resultant photosensitive resin composition to make the same insoluble.

In addition to the said components, there may be incorporated any thermal polymerization inhibitor into the photosensitive resin composition.

As the thermal polymerization inhibitor, there may be employed any one which can prevent thermal polymerization of the photopolymerizable unsaturated monomer during preparation, molding or processing of the photosensitive resin composition under heating or dark reaction of the photosensitive resin composition on storage. Specific examples are hydroquinones (e.g., hydroquinone, mono-tert-butylhydroquinone, 2,5-di-tert-butylhydroquinone), benzoquinones (e.g., benzoquinone, 2,5-di-tert-butyl-p-benzoquinone), catechols (e.g., catechol, p-tert-butylcatechol), picric acid, etc. The amount of the thermal polymerization inhibitor may be 0 to 2% by weight, preferably 0.05 to 0.5% by weight, to the total amount of the polymer (A) or (B) and the photopolymerizable unsaturated monomer.

The photosensitive resin composition of the invention is readily soluble in mere water or a dilute aqueous acid. The time required for complete dissolution is equal to or shorter than that in the case of dissolving any polymer containing no nitrogen atom in the main or side chain in an aqueous alkali.

When the photosensitive resin composition of the invention is irradiated with active lights from various light sources such as an ultrahigh pressure mercury lamp, high pressure mercury lamp, low pressure mercury lamp, xenon lamp and carbon arc lamp, the photochemical reaction of the photopolymerizable unsaturated monomer progresses within the matrix of the polymer to make the said composition insoluble in water or a dilute aqueous acid. The photosensitive resin composition thus irradiated with lights is hardly influenced by atmospheric moisture or by contact with hydrous substances and is excellent in physical strength.

The photosensitive resin composition of the invention may be employed as a photosensitive material in a simple sheet form or in a layer form with a support. The preparation of a sheet may be effected, for example, by molding the photosensitive resin composition by heat pressing, casting or melt extrusion to obtain a desired thickness. A laminated product may be prepared, for example, by sticking the photosensitive resin composition in a sheet form on a support with or without an adhesive. As the support, there may be used any suitable one such as steel, aluminum, iron, glass or plastic film.

For exposure, the photosensitive layer of the photosensitive material is closely contacted with a negative or positive film having a transparent image and subjected to irradiation with an active light. The thus irradiated material is immersed into water or a dilute aqueous acid to remove the non-exposed part off and dried, whereby a relief printing plate having an image with a distinct contour can be obtained.

The photosensitive material can be advantageously utilized not only as printing materials but also in various fields of industries such as printing, decoration, construction materials and electric parts.

Practical and presently preferred embodiments of the invention are illustratively shown in the following Examples wherein parts and % are by weight unless otherwise indicated. The reduced viscosity is determined at 30° C. with a polymer concentration of 400 mg/100 ml in a mixture of phenol and tetrachloroethane (6:4). The degree of gelation is determined by extracting the specimen after exposure with methanol by the aid of a Soxhlet's extractor for 24 hours, weighing the specimen after the extraction and making the calculation according to the following equation:

$$\text{Degree of gelation} = \frac{\text{Weight of specimen after extraction (g)}}{\text{Weight of specimen before extraction (g)}} \times 100$$

EXAMPLE 1

In a reactor, N,N'-bis($\gamma$-aminopropyl)piperazine adipate (40 parts), $\epsilon$-caprolactam (60 parts), water (50 parts) and n-butylamine (0.3 part) are charged, and after sufficient replacement of the atmosphere by nitrogen, the reactor is sealed. The temperature is gradually elevated. The inner pressure reaches 10 kg/cm$^2$, and then water is distilled out until the pressure can not be maintained at this value any more. The pressure is reduced to normal pressure in about 1 hour, and then the reaction is continued for 1.5 hours under normal pressure. The highest polymerization temperature is 255° C. Thus, a polyamide is obtained as a milky white solid substantially insoluble to water. Softening point, about 110° C. Specific viscosity, 1.59.

The above obtained polymer (100 parts), methacrylic acid (10 parts), acrylamide (20 parts), methylenebisacrylamide (10 parts), benzophenone (2 parts) and hydroquinone (0.2 part) are dissolved in methanol (300 parts) under heating. The resultant solution is poured on the surface of a glass plate and allowed to stand under reduced pressure as so to evaporate the methanol completely, whereby a transparent photosensitive resin composition film of 0.8 mm in thickness is obtained. The resin composition is readily soluble in water at room temperature.

The film is stuck on a polyethylene terephthalate film of 0.2 mm in thickness, and a negative film is placed on the photosensitive layer. Then, exposure is effected by irradiation with a fluorescent lamp for reproduction BA-37 (manufactured by Matsushita Electric Industrial Co., Ltd.) for 4 minutes. The irradiated product is developed in a neutral water stream at 20° C. for 3 minutes under a pressure of 0.5 kg/cm$^2$, whereby a relief printing plate in which the original image is reproduced accurately and which shows an excellent printability is obtained.

EXAMPLE 2

In a reactor, the nylon salt of 6-methyl-6-(N,N'-diethylaminomethyl)-4,8-dioxaundecanediamine with adipic acid (100 parts) and water (100 parts) are charged, and after sufficiently replacing the atmosphere by nitrogen, the temperature is elevated. When the inner pressure reaches 5 kg/cm$^2$, the distilling out of water is effected so as to maintain the pressure at this value. When 80% of the added water is distilled out, the pressure begins to be reduced gradually and is made normal in about 30 minutes. The reaction is continued at 260° C. for 2 hours under normal pressure in a nitrogen stream to obtain a polyamide as a pale yellow solid. Softening point, 125° to 127° C. Specific viscosity, 1.58.

The thus obtained polyamide (100 parts), methacrylic acid (12 parts), ethylene glycol dimethacrylate (8 parts), methyl methacrylate (15 parts), benzophenone (2 parts) and hydroquinone (0.1 part) are dissolved in methanol (200 parts) under heating, and the resulting solution is concentrated to remove the methanol, whereby a solid transparent photosensitive resin composition is obtained. This composition is readily soluble in cold water.

The thus obtained photosensitive resin composition is subjected to preparation of a photosensitive material, which is then exposed, developed and dried as in Example 3 whereby a relief printing plate having a good printability in which the original image is accurately reproduced is obtained.

EXAMPLE 3

A homopolyamide (100 parts) obtained by polycondensation of the nylon salt of N,N'-bis(3-aminopropyl)-piperazine with sebacic acid is dissolved in methanol (300 parts). To the resultant solution, 20% hydrochloric acid (50 parts) and glycidyl methacrylate (58.5 parts) are added, and the mixture is stirred for 24 hours under reflux in a water bath of 75° C. The reaction mixture is dropwise added to a largely excess amount of ethyl acetate under stirring to precipitate a glycidyl methacrylate-modified polyamide, which is collected by filtration and dried. The polyamide is again dissolved in an about three times amount of methanol and re-precipitated with ethyl acetate to obtain the modified polyamide (123 parts) as a white solid soluble in water and methanol.

To a solution of the above obtained modified polyamide (10 parts) in methanol (40 parts), benzoin methyl ether (0.1 part) and hydroquinone monomethyl ether (0.02 part) are added to make a uniform solution, from which the methanol is removed by evaporation in a dark room. The residue is dried at 40° C. for 16 hours under reduced pressure whereby a uniform transparent sheet of 0.54 mm in thickness is obtained.

A part of the sheet is subjected to irradiation by the aid of a low pressure mercury lamp (500 W) for 5 minutes from a distance of 10 cm and then extracted with methanol by a Soxhlet's extractor for 24 hours. The degree of gelation is 93.4%. The non-irradiated sheet is soluble in water and methanol.

REFERENCE EXAMPLE 1

The procedure as in Example 3 is repeated except that water (50 parts) is employed in place of 20% hydrochloric acid (50 parts) to obtain a polyamide being soluble in methanol but not soluble in water.

Using the polyamide (10 parts) in place of the modified polyamide (10 parts), the same procedure as in Example 3 is repeated to make a uniform transparent sheet. The degree of gelation determined by methanol extraction after exposure is 0%. The non-irradiated sheet is also soluble in methanol.

EXAMPLE 4

A copolymerized polyamide (10 parts) obtained by polycondensation of ε-caprolactam (50 parts) and the nylon salt of N-(2-aminoethyl)piperazine with adipic acid (50 parts) is dissolved in ethanol (40 parts), and 20% hydrochloric acid (3.05 parts) and glycidyl acrylate (3.22 parts) are added thereto. The mixture is stirred for 24 hours under reflux in a water bath of 85° C. The reaction mixture is treated with ethyl acetate so as to precipitate a glycidyl acrylate-modified polyamide as a white solid as in Example 3.

The thus obtained modified polyamide (5 parts), benzophenone (0.05 part) and hydroquinone monomethyl ether (0.01 part) are dissolved uniformly in methanol (20 parts), and the solution is evaporated in a dark room to remove the methanol. The residue is dried at 40° C. for 16 hours under reduced pressure whereby a uniform transparent sheet of 0.47 mm in thickness is obtained.

A part of the sheet is subjected to irradiation for 4 minutes by the aid of a low pressure mercury lamp (500 W) from a distance of 10 cm, and then extracted with methanol. The degree of gelation is 87.6%. The nonirradiated sheet is soluble in water and methanol.

EXAMPLE 5

A copolymerized polyamide (10 parts) obtained by polycondensation of ε-caprolactam (60 parts) and the nylon salt of N,N'-bis(3-aminopropyl)piperazine with adipic acid (40 parts) is dissolved in ethanol (30 parts) and water (10 parts), and acrylic acid (0.94 part) and glycidyl methacrylate (2.70 parts) are added thereto. The mixture is stirred for 24 hours under reflux in a water bath of 85° C. To the reaction mixture, benzoin methyl ether (0.2 part) and hydroquinone monomethyl ether (0.05 part) are added to make a uniform solution, from which the ethanol is removed by evaporation in a dark room. The residue is dried at 40° C. for 24 hours under reduced pressure to obtain a sheet. The sheet is cut into pieces and pressed at 130° C. to give a uniform transparent sheet of 0.65 mm in thickness, which is stuck to an iron plate to make a uniform photosensitive material.

The photosensitive material is closely contacted with a negative film in vacuo and subjected to irradiation for 3 minutes by the aid of a chemical lamp (400 W) from a distance of about 5 cm. The irradiated material is sprayed with tap water at 30° C. through a nozzle under a pressure of 4 kg/cm$^2$ so as to remove the non-irradiated part, whereby a distinct relief printing plate in which the original image is accurately reproduced is obtained. The printability of the relief printing plate is excellent.

What is claimed is:

1. A water-soluble photosensitive resin composition which comprises a polyamide or its ammonium salt having recurring amide groups in the main chain thereof and basic nitrogen atoms in the main or side chain thereof, from 5 to 150% by weight with respect to said polyamide or its ammonium salt of a photopolymerizable unsaturated monomer and from 0.1 to 5% by weight with respect to the total amount of said polyamide or its ammonium salt and the photopolymerizable unsaturated monomer, of a photosensitizer, said polyamide being prepared by the polycondensation of starting monomers comprising from 10 to 100 mol % of a compound having the following formula:

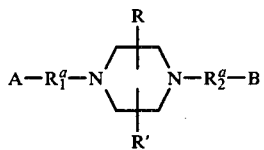

wherein R and R' are each a hydrogen atom or a hydrocarbon group, $R_1^a$ and $R_2^a$ are each an alkylene group, and A and B are each —$NH_2$, —COOH or —COOR" wherein R" is a hydrocarbon group, and in which the group —$R_2^a$—B may represent a hydrogen atom, and said ammonium salt being prepared by the treatment of said polyamide with a protonic acid, a quaternizing agent or an epoxy compound and a protonic acid.

2. The photosensitive resin composition according to claim 1, wherein said starting monomer is the one of the formula (I), wherein A and B are each —$NH_2$.

3. The photosensitive resin composition according to claim 1, wherein said starting monomer is N,N'-bis(γ-aminopropyl)piperazine.

4. The photosensitive resin composition according to claim 3, wherein N,N'-bis(γ-aminopropyl)piperazine is used in the form of adipate.

5. The photosensitive resin composition according to claim 1, wherein the amount of the photopolymerizable unsaturated monomer in said composition is from 10 to 100% by weight with respect to said polyamide or its ammonium salt.

6. The photosensitive resin composition according to claim 1, wherein the amount of the photosensitizer in said composition is from 0.1 to 2% by weight with respect to the total amount of said polyamide or its ammonium salt and the photopolymerizable unsaturated monomer.

7. The photosensitive resin composition according to claim 1, which further comprises a thermal polymerization inhibitor in an amount of not more than 2% by weight with respect to the total amount of said polyamide or its ammonium salt and the photopolymerizable unsaturated monomer.

8. A shaped photosensitive material developable with water comprising the photosensitive resin composition according to claim 1.

9. The photosensitive material according to claim 8, which is shaped in a sheet.

10. The photosensitive material according to claim 8, which comprises a layer of said photosensitive resin composition and a support therefor.

11. The photosensitive material according to claim 8, which is used as a photosensitive printing plate.

12. In a photosensitive resin composition comprising a polyamide having recurring amide groups in the main chain and prepared through the step of polycondensation of one or more of dicarboxylic acids, diamines, ω-amino acids and lactams as the starting monomers under the condition that the carboxyl groups and the amino groups therein are substantially in equivalent amounts, from 5 to 150% by weight with respect to said polyamide of a photopolymerizable unsaturated monomer and from 0.01 to 5% by weight with respect to the total amount of said polyamide and the photopolymerizable unsaturated monomer of a photosensitizer, an improvement wherein the starting monomers comprise at least one compound of the formula:

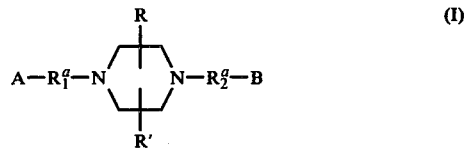

wherein R and R' are each a hydrogen atom or a hydrocarbon group, $R_1^a$ and $R_2^a$ are each an alkylene group, and A and B are each —$NH_2$, —COOH or —COOR" wherein R" is a hydrocarbon group, and in which the group —$R_2^a$—B may represent a hydrogen atom, in an amount of from 10 to 100 mol % of the starting monomers, so that the polyamide has basic nitrogen atoms in the main or side chain thereof and is water-soluble, whereby the photosensitive resin composition is made substantially water-soluble.

13. The improvement according to claim 12, wherein the polyamide is present in an ammonium salt form.

14. The improvement according to claim 13, wherein the ammonium salt form is prepared by treatment of the corresponding polyamide in a free form with a protonic acid, a quaternizing agent or an epoxy compound and a protonic acid.

15. The improvement according to claim 12, wherein the compound (I) is N,N'-bis(ω-aminopropyl)piperazine.

16. The improvement according to claim 15, wherein the N,N'-bis(ω-aminopropyl)piperazine is used in an adipate form.

* * * * *